United States Patent
Choi et al.

(10) Patent No.: US 8,230,303 B2
(45) Date of Patent: Jul. 24, 2012

(54) MEMORY SYSTEM AND DATA PROCESSING METHOD THEREOF

(75) Inventors: Jin-Hyeok Choi, Yongin-si (KR); Hwaseok Oh, Yongin-si (KR); Jong-uk Song, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 575 days.

(21) Appl. No.: 12/512,097

(22) Filed: Jul. 30, 2009

(65) Prior Publication Data

US 2010/0064200 A1   Mar. 11, 2010

(30) Foreign Application Priority Data

Sep. 5, 2008 (KR) .................. 10-2008-0087877

(51) Int. Cl.
*G11C 29/00* (2006.01)

(52) U.S. Cl. .................. 714/773; 714/763

(58) Field of Classification Search .......... 714/773, 714/763

See application file for complete search history.

(56) References Cited

U.S. PATENT DOCUMENTS

| | | | |
|---|---|---|---|
| 5,606,532 A * | 2/1997 | Lambrache et al. ....... 365/238.5 |
| RE37,327 E * | 8/2001 | Yonemitsu et al. .......... 386/243 |
| RE38,502 E * | 4/2004 | Yonemitsu et al. ........ 369/30.04 |
| 6,751,766 B2 | 6/2004 | Guterman et al. |
| 7,346,828 B2 * | 3/2008 | Kojima ........................ 714/755 |
| 2005/0268208 A1 | 12/2005 | Shimizume et al. |
| 2008/0123408 A1 | 5/2008 | Honma et al. |
| 2008/0301532 A1 * | 12/2008 | Uchikawa et al. ............ 714/773 |
| 2010/0131827 A1 * | 5/2010 | Sokolov et al. ............... 714/763 |

FOREIGN PATENT DOCUMENTS

| | | |
|---|---|---|
| JP | 2001-332096 | 11/2001 |
| JP | 2005-346758 | 12/2005 |
| JP | 2008-016092 | 1/2008 |
| JP | 2008-077810 | 4/2008 |
| KR | 1020050027216 A | 3/2005 |
| KR | 1020060048089 A | 5/2006 |
| KR | 1020080004374 A | 1/2008 |
| WO | WO 03/100791 A1 | 12/2003 |

* cited by examiner

*Primary Examiner* — Joseph D Torres
(74) *Attorney, Agent, or Firm* — Volentine & Whitt, PLLC

(57) ABSTRACT

A data processing method of a memory system including a flash memory, which includes judging whether data initially read from a selected page of the flash memory is correctable. If the initially read data is judged not to be correctable, the data is newly read from the selected page based upon each of newly determined read voltages. Thereafter, error-free sub-sectors of the newly read data are collected based upon EDC data corresponding to the initially read data. The data of the error-free sub-sectors are then corrected based upon ECC data corresponding to the initially read data.

20 Claims, 19 Drawing Sheets

MEMORY SYSTEM AND DATA PROCESSING METHOD THEREOF

A claim of priority under 35 U.S.C. §119 is made to Korean Patent Application No. 10-2008-0087877, filed Sep. 5, 2008, the entirety of which is incorporated herein by reference.

BACKGROUND OF THE INVENTION

1. Field of the Invention

The present invention generally relates to electronic devices, and more particularly, the present invention relates to a memory system and data processing techniques associated with memory systems.

2. Description of the Related Art

A flash memory device is a type of EEPROM wherein a plurality of memory regions are erased or programmed via one program operation. A conventional EEPROM enables one memory region to be erased or programmed at a stroke. This means that a flash memory device operates faster and at a more effective speed when systems using flash memory devices read and write to different memory regions at the same time. All types of flash memories and EEPROMs may wear out after a specific number of erase operations due to failure of the insulation film that surrounds the charge storing means used to store data.

An advantage of a flash memory device is that it may store information on a silicon chip in a manner whereby no power is needed to retain the stored information. This means that in the event power is cut off to the chip, information is retained without power consumption. Further characteristics of flash memory devices include impact resistance and rapid read access time. In view of these characteristics, flash memory devices are generally used for storage in devices which are supplied with power from a battery. Flash memory devices are divided into two types according to logic gate type, that is NOR flash memory devices and NAND flash memory devices.

A flash memory device stores information in an array of transistors each called a cell, which stores 1-bit information. Newer flash memory devices such as multi-level cell devices are capable of storing more than one bit per cell by varying an amount of charge applied to the floating gate of a cell.

In flash memory devices with floating gates, the most critical reliability concerns are data-retention characteristics and the number of program/erase cycles that may be performed without degradation (or endurance). The stored charge (electrons) can leak away from a floating gate by various failure mechanisms such as thermoionic emission and charge diffusion through defective interpoly dielectrics, ionic contamination, program disturb stresses, and the like. This causes a decrease in threshold voltage. The opposite effect of charge gain can occur when the floating gate slowly gains electrons with the control gate held at a voltage (e.g., a power supply voltage or a read voltage) due to a read disturbance, thus causing an increase in the threshold voltage.

As a result, the threshold voltage distribution of memory cells may be increasingly widened due to charge loss and charge gain. For example, assume that 2-bit data is stored in each memory cell. With this assumption, as illustrated in FIG. 1A, each memory cell may have one of an erase state E and three program states P1, P2 and P3. Ideally, constant cell margins (or read margins) exist between states E, P1, P2, and P3, whereby threshold voltage distributions 10, 11, 12, and 13 as shown respectively correspond to the states E, P1, P2, and P3. However, as illustrated in FIG. 1B, the threshold voltage distributions 10, 11, 12, and 13, particularly the threshold voltage distributions 11, 12, and 13 respectively corresponding to the program states P1, P2, and P3, are widened due to the above-described charge loss and charge gain. This means that the data read out from the memory cells may include many erroneous bits. In particular, this phenomenon becomes serious as the number of data bits stored in a memory cell is increased.

SUMMARY OF THE INVENTION

The present invention is directed to provide a data processing method of a memory system including a flash memory, the data processing method including judging whether data initially read from a selected page of the flash memory is correctable; newly reading data from the selected page based upon each of newly determined read voltages, if the initially read data is judged not to be correctable; collecting error-free sub-sectors of the newly read data, based upon EDC data corresponding to the initially read data; and correcting data of the error-free sub-sectors based upon ECC data corresponding to the initially read data.

The present invention is further directed to further provide a memory system which comprises a flash memory; and a memory controller including an error correction processor and an ECC block, the memory controller configured to control the flash memory, wherein when data initially read from a selected page of the flash memory is judged not to be correctable by the ECC block, the error correction processor controls the flash memory such that the data is newly read from the selected page according to each of newly determined read voltages, and the error correction processor collects error-free sub-sectors of the newly read data based upon EDC data corresponding to the initially read data.

BRIEF DESCRIPTION OF THE FIGURES

The above and other objects and features of the present invention will become apparent from the following description with reference to the following figures, wherein like reference numerals refer to like parts throughout the various figures unless otherwise specified, and wherein.

DETAILED DESCRIPTION OF THE EMBODIMENTS

Figure 1A:
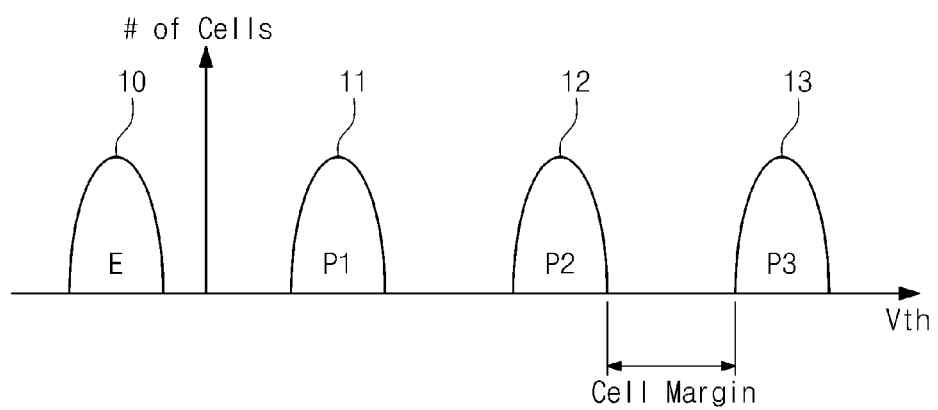
FIGS. 1A and 1B are diagrams for explaining the widening of threshold voltage distributions of memory cells due to charge loss and charge gain.

Various embodiments of the invention will be hereinafter described in detail with reference to the accompanying drawings, with a flash memory device as an example for illustrating structural and operational features. The inventive concept may however be embodied in different forms and should not be construed as limited to the embodiments set forth herein. Rather, these embodiments are provided so that this disclosure will be thorough and complete, and will fully convey the scope of the embodiments to those skilled in the art. Like reference numerals refer to like elements throughout the accompanying figures.

The term "sector" used in this specification should be understood to mean an ECC (Error Correction Code) process unit. For ease of description, the embodiments will be described under the assumption that one sector consists of an ECC process unit. However, it is possible to constitute the ECC process unit with two or more sectors. Further, the term indicating the ECC process unit is not limited to the sector.

Figure 2:
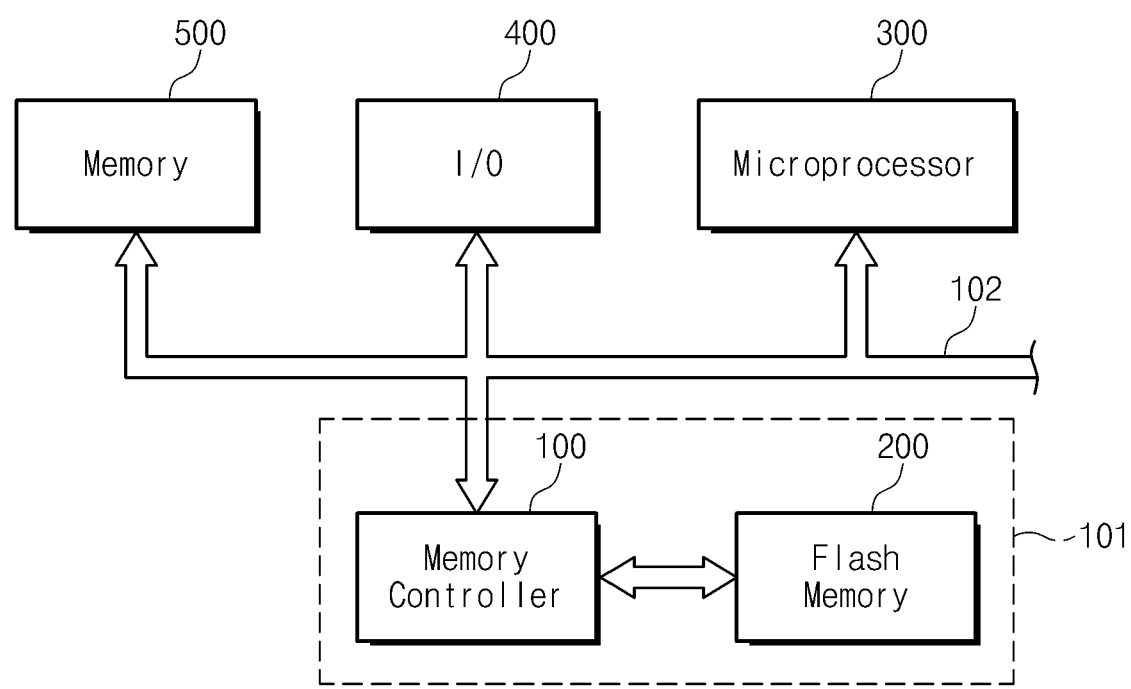
FIG. 2 is a block diagram showing a memory system in which various embodiments of the invention are realized.

FIG. 2 is a block diagram showing a memory system in which various embodiments of the invention are realized. Referring to FIG. 2, a memory system 101 is connected with a system bus 102 of a host electronic system such as a computer system. Some exemplary host electronic systems may include a computer using the memory system 101, laptop computers, handheld computers, palmtop computers, PDA, MP3 and other audio players, digital cameras, video cameras, electronic game machines, wireless and wired telephony devices, answering machines, voice recorders, network routers, or other systems.

The host electronic system may include the system bus 102, a central processor 300 such as a microprocessor, input-output devices such as circuit 400 for providing interconnection with circuits, and a volatile memory 500, as shown in FIG. 2. Some exemplary input-output devices may include a keyboard, a monitor, a modem, and the like. The memory system 101 may include a memory controller 100 and a flash memory 200 having an array of flash memory cells. The memory controller 100 and the flash memory 200 may be an integrated circuit, which is often called a chip. Alternatively, two or more integrated circuit chips may together form the memory system 101. For example, the memory controller 100 may be a dedicated integrated circuit, and the flash memory 200 may be one or more chips according to a required memory capacity. The memory system 101 may be packed as a small card which may be permanently installed at a computer (host device) or removably connected to/from a host. Flash memory 200 may store single-bit data and/or multi-bit (multi-level) data. In particular, each memory cell of the flash memory 200 may store 2-bit data, 3-bit data, or 4-bit data.

Figure 3:
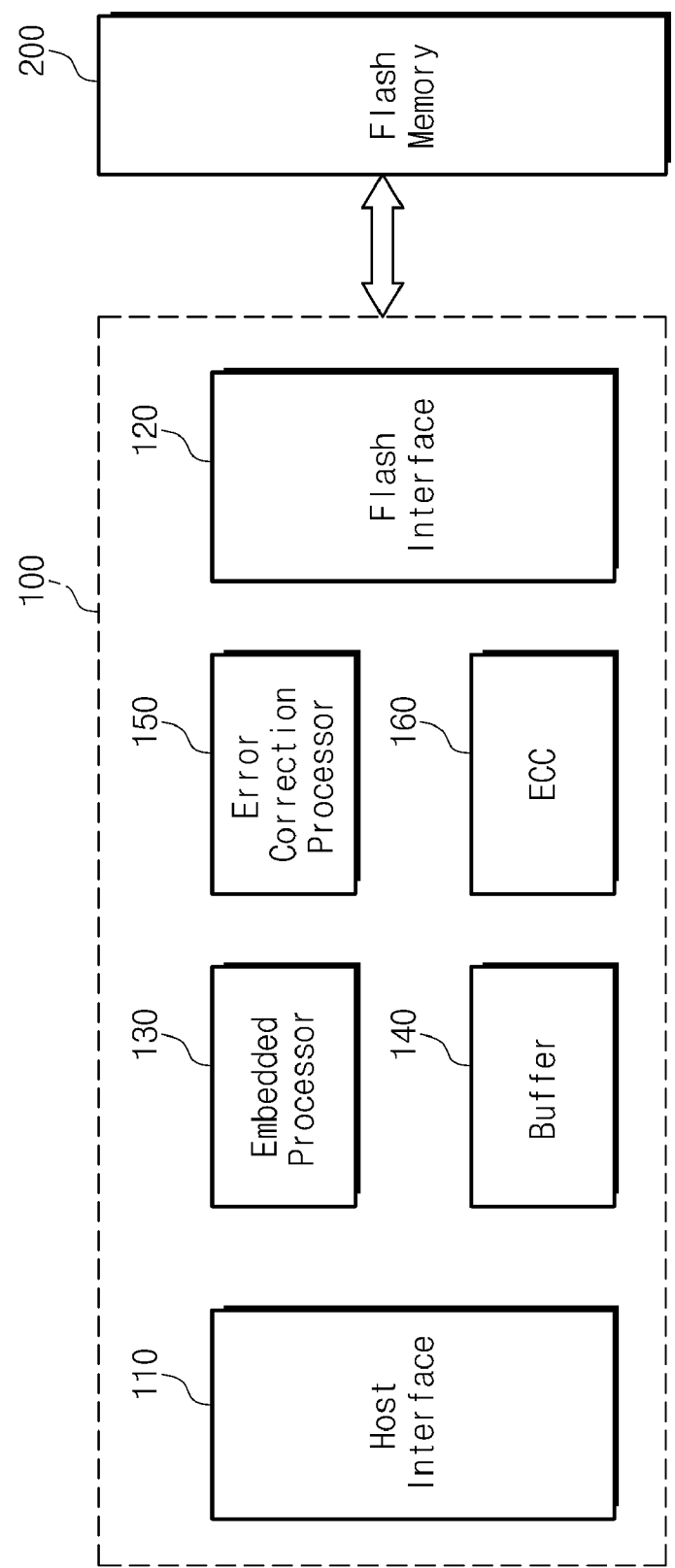
FIG. 3 is a block diagram showing a memory system according to an embodiment of the invention.

FIG. 3 is a block diagram showing a memory system according to an embodiment of the invention. Referring to FIG. 3, memory controller 100 may include host interface 110, flash interface 120, embedded processor 130, buffer 140, error correction processor 150, and ECC block 160.

The host interface 110 shown in FIG. 3 may provide an interface with an external device (i.e., host system), and the flash interface 120 may provide an interface with flash memory 200. For example, the flash interface 120 may control read and write operations with respect to the flash memory 200 according to a request by the external device (e.g., host system). The embedded processor 130 may control an overall operation of the memory controller 100. The buffer 140 may be used to temporarily store data that is to be stored in the flash memory 200, or data that is read out from the flash memory 200. Further, the buffer 140 may be used to store data processed within the memory controller 100. The buffer 140 may be formed of one or more volatile memories. The error correction processor 150 may change data that is to be stored in the flash memory 200 into data of which errors are easily detectable during a subsequent write operation, as will be subsequently described hereinafter. The error correction processor 150 may also minimize erroneous bits of data read out from the flash memory 200 during a read operation, as will also be described hereinafter. The ECC block 160 may generate ECC (error correction code) data from data to be stored in the flash memory 200 during a write operation, and may detect and correct error in data read out from the flash memory 200 during a read operation. The ECC block 160 may be realized to have general error correction ability.

Figure 4:
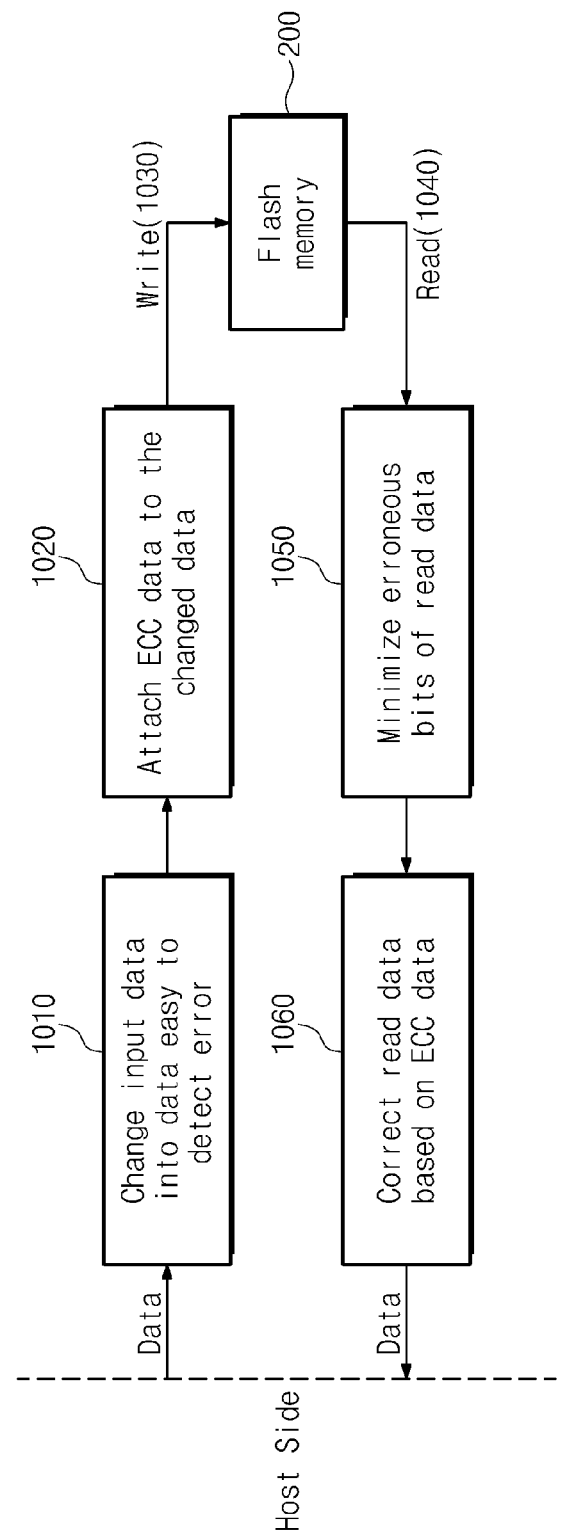
FIG. 4 is a diagram for describing data processing or handling of the memory system.

FIG. 4 is a diagram for describing data processing or handling of the memory system shown in FIG. 3. Referring to FIG. 4, when a write operation is requested by an external device (i.e., host system), there may be data input from the host system to memory system 101. The input data may be stored temporarily in buffer 140 via host interface 110. At this time in block 1010, the input data temporarily stored may be changed by error correction processor 150 to data of which it is easy to detect an error. A coding method for generating data of which it is easy to detect an error may be realized variously, which will be described hereinafter. In block 1020, ECC data is added into the changed data by the ECC block 160. As indicated by reference numeral 1030, the changed data may be stored in the flash memory 200 together with the ECC data. When a read operation is requested by the external device (host system), data may be read out from the flash memory 200 as indicated by reference numeral 1040. As set forth above, the read data may include the changed data and the ECC data. Then in block 1050, erroneous bits of the read data may be minimized by the error correction processor 150 without regard to the ECC data. In block 1060, an error within the read data may be detected and corrected by the ECC block 160 based upon the ECC data. The error-processed data may then be sent to the external device (host system).

In an embodiment of the invention, the operation of changing the input data to data of which it is easy to detect an error is executed not at the time of input of the data to the memory controller, but in contrast at the time of transfer of the data to a flash memory. It is thus possible to correct erroneous bits over an error correction capability of ECC block 160 with a general error correction capability, by changing data at the time of a write operation into data of which it is easy to detect an error and minimizing erroneous bits of the changed data at the time of a read operation.

Figure 5:
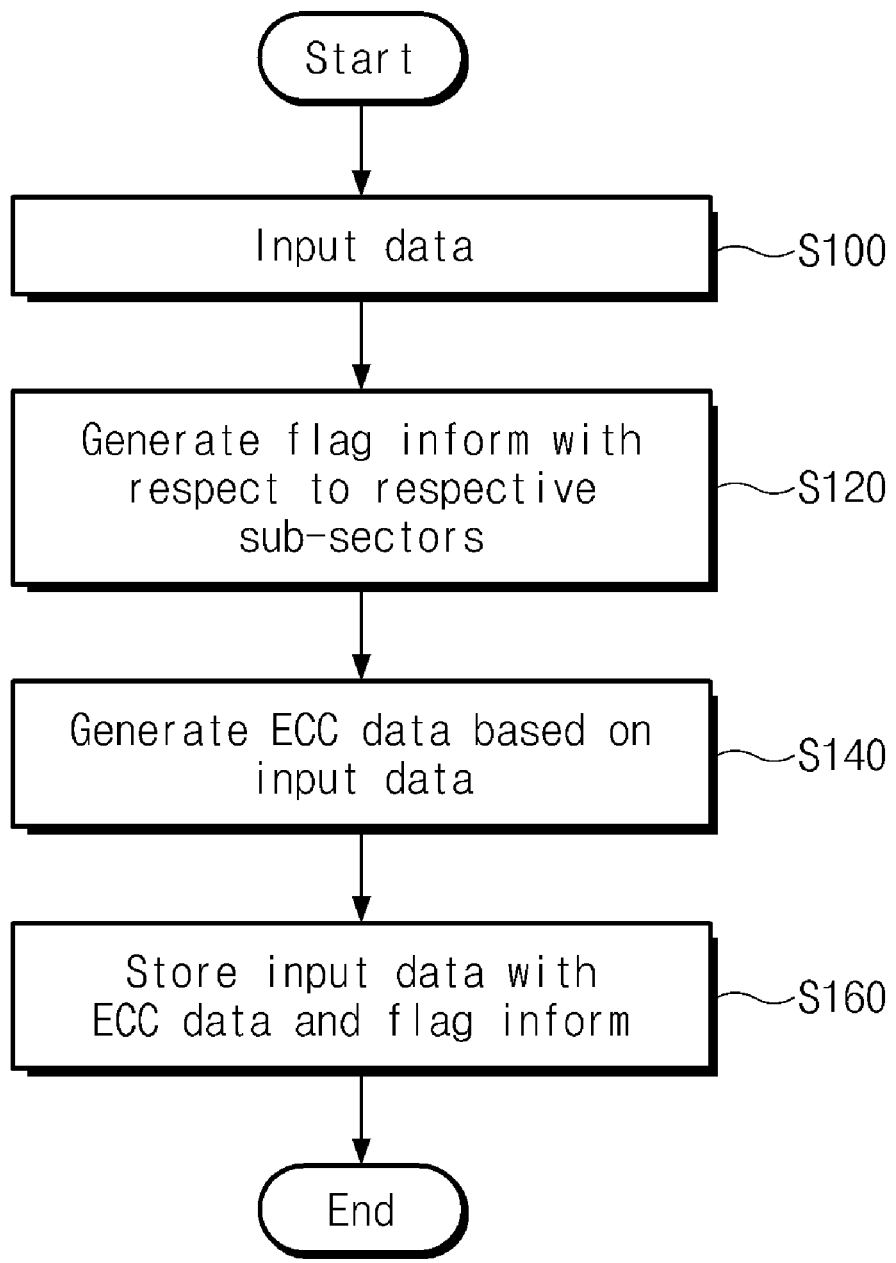
FIG. 5 is a flow chart showing a write method used in the memory system.
Figure 6:
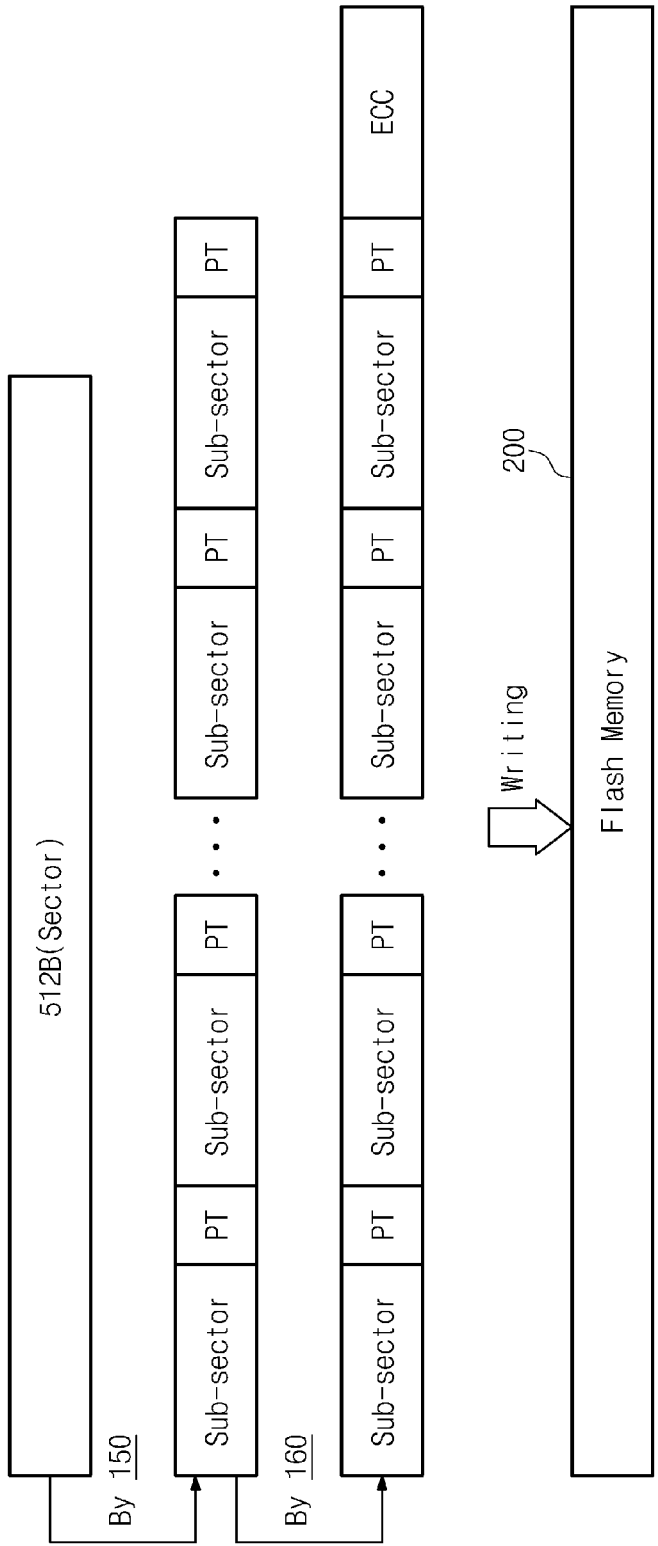
FIG. 6 is a diagram showing the manner in which data is changed in accordance with the write method.

FIG. 5 is a flow chart showing a write method used in the memory system, and FIG. 6 is a diagram showing the manner in which data is changed in accordance with the write method. The write method of the memory system will hereinafter be described with reference to FIGS. 5 and 6.

When a write operation is requested by an external device (i.e., host system), in step S100 data to be written in flash memory 200 may be stored in buffer 140 via host interface 110. For example, input data may be sector data. That is, 512B data may be stored sequentially in buffer 140 according to a transfer unit. In step S120, error correction processor 150 may divide the input data into a plurality of sub-sectors (or a plurality of groups). Flag information may be generated to enable detection of error in a corresponding sub-sector, and the flag information may be parity data. The parity data may be formed of N-bit parity data (N being an integer greater than or equal to 1). Accordingly, as illustrated in FIG. 6, the input 512B sector data may be divided into a plurality of sub-sector data, and N-bit parity data PT may be added to each sub-sector data, to provide changed data of which it is easy to detect an error. This may be executed via error correction processor 150. The number of sub-sectors can be changed variously.

The input data, that is the data that is changed to data of which it is easy to detect an error, may then be transferred to the flash memory 200. At the time of transfer, ECC block 160 may first generate in step S140 ECC data using the input data according to a well-known manner. The ECC data may be generated based upon flag information and input data, or upon input data. Then, in step S160, the input data may be stored in the flash memory 200 together with ECC data and flag information. The input data may be stored in a main field (or region) of the flash memory 200, and the ECC data and flag information may be stored in a spare field (or region) of the flash memory 200.

Figure 7:
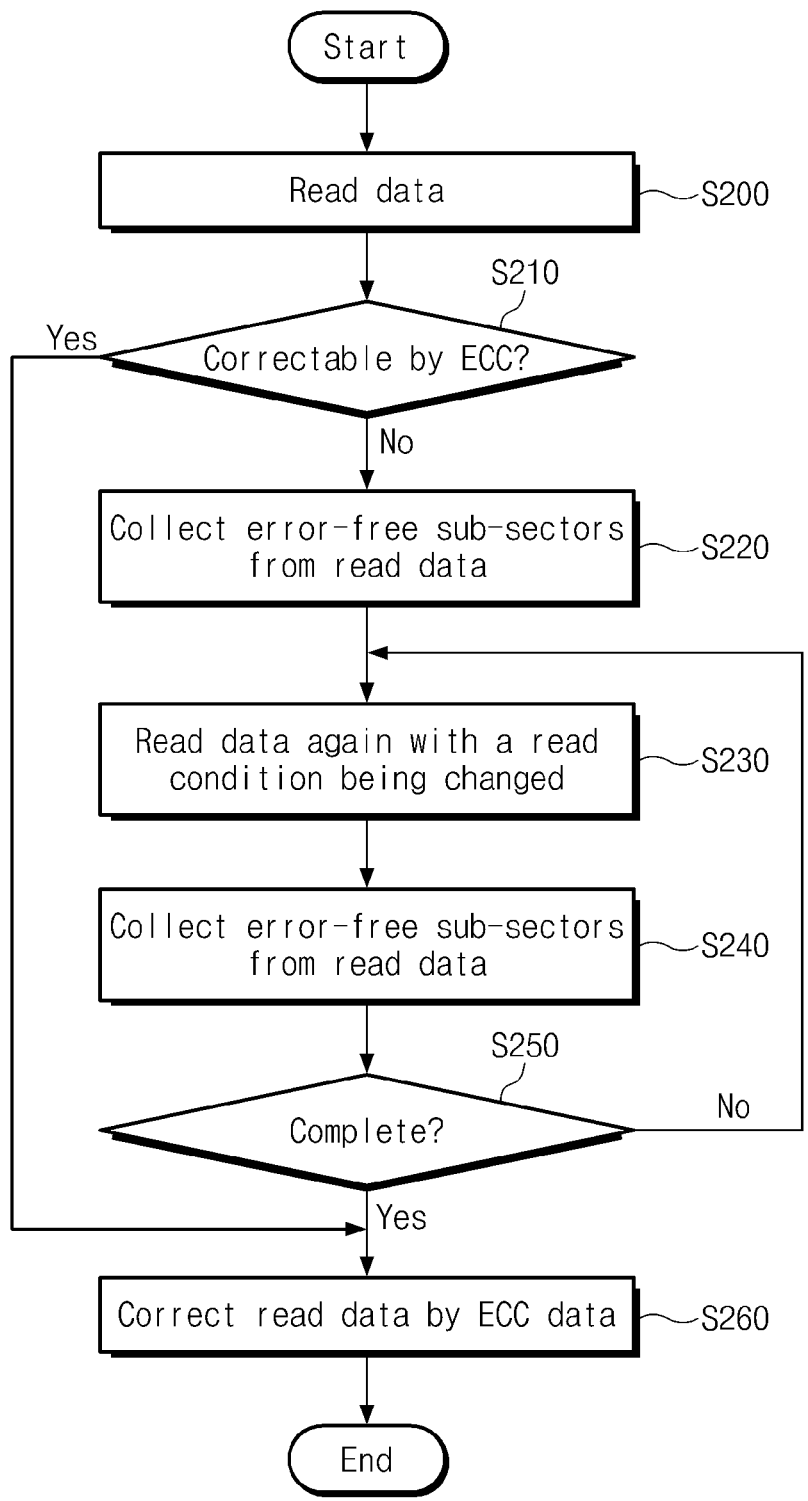
FIG. 7 is a flow chart showing a read method used in the memory system.
Figure 8:
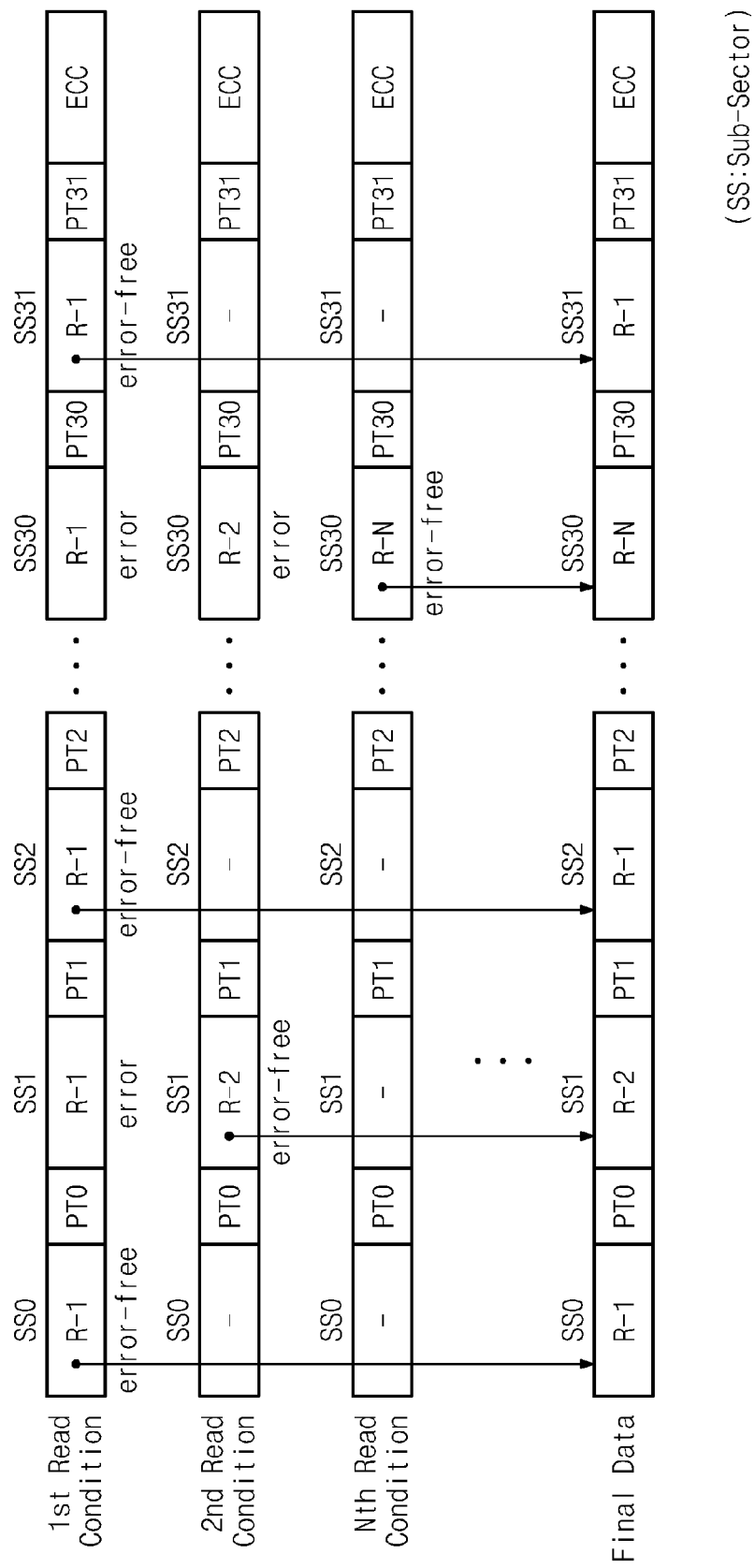
FIG. 8 is a diagram showing the manner in which data is read in accordance with the read method.

FIG. 7 is a flow chart showing a read method used in the memory system, and FIG. 8 is a diagram showing the manner in which data is read in accordance with the write method. The read method of the memory system will hereinafter be described with reference to FIGS. 7 and 8.

As a read operation is requested, data may be read out from flash memory 200 under the control of memory controller 100. In greater detail, in step S200 data may be read out from the flash memory 200 under the control of the memory controller 100. The read data may include the ECC data and flag information, and may be stored in a buffer 140. In a well known manner, ECC block 160 may detect whether the read data is erroneous. If an error is detected, the ECC block 160 may judge in step S210 whether the detected error is correctable. If the detected error is correctable, error of the read data may be corrected in step S260 based upon the ECC data according to a well-known manner, and afterwards the corrected read data may be sent to an external device (i.e., host system) and the read operation may be ended. Likewise, if an error is not detected, the read data may be transferred to an external device (i.e., host system), and the read operation may be ended.

Returning to step S210 in FIG. 7, if the detected error is judged not to be correctable by the ECC block 160, error-free sub-sectors of the sub-sectors of the read data may be collected under the control of error correction processor 150 in step S220. Error-free sub-sectors may be selected based upon corresponding flag information, that is the corresponding par-ity data. That is, the error correction processor 150 may judge whether data of each sub-sector stored in the buffer 140 is erroneous, based upon the corresponding parity data. According to the judgment result, error-free sub-sectors, that is final data, may be stored in another region of the buffer 140 as illustrated in FIG. 8. After error-free sub-sectors are collected, the error correction processor 150 may subsequently control the flash memory 200 in step S230 such that data is read out from the flash memory 200 under a different read condition. For example, the error correction processor 150 may control the flash memory 200 via a flash interface 120 such that a read voltage for a current read operation becomes lower/higher by a given voltage than a read voltage for a previous read operation. Alternatively, the error correction processor 150 may control the flash memory 200 such that a read voltage is set to a given voltage and is gradually increased according to repetition of a read operation. Data again read under the changed read condition may be stored in the buffer 140.

As an example, a start read voltage determined at repetition of a read operation may be lower than a read voltage used during a first read operation, and may be determined variously considering the number of data bits stored in a memory cell, a data retention time, and the like. Alternatively, a start read voltage determined at repetition of a read operation may be higher than a read voltage used during a first read operation. Repetition of the read operation is executed under the control of embedded processor 130 instead of the error correction processor 150.

In step S240, the error correction processor 150 may collect error-free sub-sectors of the sub-sectors of data read according to the changed read condition. In this case, sub-sectors which are previously judged as error-free sub-sectors may be excluded from the judgment step. As set forth above, an error-free sub-sector may be selected based upon corresponding flag information, that is, corresponding parity data. In step S250, it is judged whether the above-described error judging and read process for all sub-sectors is complete. If the error judging and read process for all sub-sectors is judged as not complete, processing returns to step S230. If the error judging and read process for all sub-sectors is judged complete, processing advances to step S260, in which error of the read data may be corrected based upon the ECC data according to a well-known manner. Afterwards, the corrected read data may be transferred to an external device (i.e., host side), and the read operation may be completed.

In the above embodiment, the error judging and read process for sub-sectors may be limited to a given read number for an erroneous sub-sector. For example, although any sub-sector is judged to be erroneous within a given read number for the erroneous sub-sector, the error judging and reading process for all sub-sectors may be treated to be completed by the error correction processor 150.

Figure 1B:
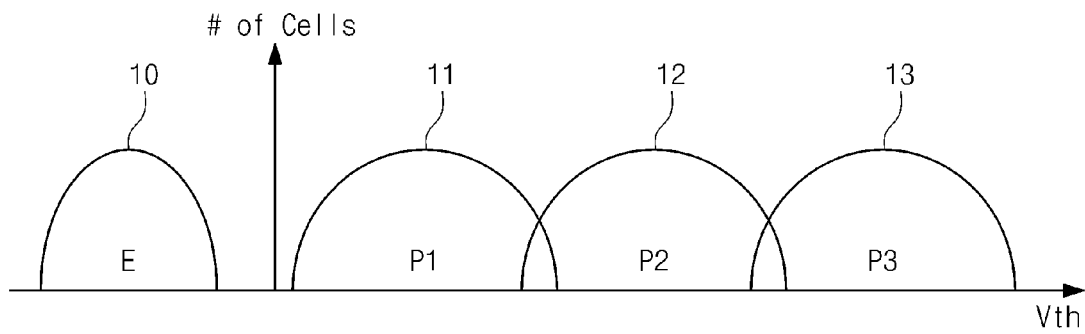

As understood from the above description, it is possible to minimize the number of erroneous bits of read data by changing input data to data of which it is easy to detect an error, and collecting error-free sub-sectors of data read via an iterative read process. Afterwards, error-minimized data may be corrected based upon ECC data. In other words, adjacent threshold voltage distributions may be overlapped due to a fabricating process, an increase in data bits stored in a memory cell, charge loss, and charge gain as illustrated in FIG. 1B. An error exceeding an error correction capacity of ECC block 160 arises due to overlapping of adjacent threshold voltage distributions. Although an error correction capacity of the ECC block 160 is not improved, it is possible to correct an error exceeding the error correction capacity of the ECC block 160 via the data processing manner of the above embodiment.

In the above embodiment, a bit number of parity data as flag information may be changed variously. Some example methods will be more fully described below.

Using 1-Bit Parity Data

In the case of 1-bit parity data, parity data is set to '1' when the number of '1's is odd and to '0' when the number of '1's is even. In a case where one bit of data in a sub-sector is read erroneously under this condition, since calculated parity data and read parity data (stored at a write operation) are different from each other, such a sub-sector may be judged as an erroneous sub-sector by error correction processor 150. In the case that two data bits of data in a sub-sector are damaged, it is impossible to judge whether the sub-sector is erroneous. But, in real circumstances for example, it is assumed in such a case that although an ECC block 160 has 8-bit ECC capacity, data can not be restored due to generation of a 10-bit error. With this assumption, in the case of dividing one sector into 32 sub-sectors, the probability that no 10-bit error is restored since two bits are simultaneously generated at one sub-sector, is low. For this reason, it is possible to apply the above-described parity scheme. If an error of another sub-sector is restored although such an error arises, an error bit number of a sector is within a correctable range of the ECC block 160, so that data is restored via a final ECC process (ECC block).

Using 2-Bit Parity Data

In the case of using 2-bit parity data, X modulo 4 may be determined as parity data. Herein, X indicates the number of '1's included in a sub-sector. That is, it is assumed that a size of the sub-sector is 16. Under this assumption, if the number of '1's included in a 16B sub-sector is 65, 64 modulo 4 is 1. Accordingly, '01' corresponding to '1' may be determined as 2-bit parity data. In this case, since it is possible to judge whether an error is generated and whether the number of '1's is more or less, data is able to be compensated more exactly. In a case where two data bits of one sub-sector are damaged, if data '0' of one bit is accidentally read as data of '1' and data of '1' of another bit is accidentally read as data of '0', it is impossible to recover data. But, since such a probability is very low and error generation is considerably lowered, it is possible to detect and correct an error via the ECC block 160 with the general error correction capability (e.g., 8-bit ECC or 16-bit ECC).

As another example, in the case of using 3-bit parity data, it is possible to increase the error detection capability by determining X modulo 8 (X being the number of '1's included in a sub-sector) like the 2-bit parity data.

In an exemplary embodiment, Cyclic Redundancy Check (CRC) can be used as parity. In this case, as compared with the above-described method, an error can be detected although '0' and '1' errors are made simultaneously. That is, in the case of using 3-bit parity data, it is possible to increase the capability of detecting an error. On the other hand, it is impossible to judge whether the number of '1's is more or less.

It should be understood that a parity making method according to exemplary embodiments is not limited to this disclosure.

Figure 9:
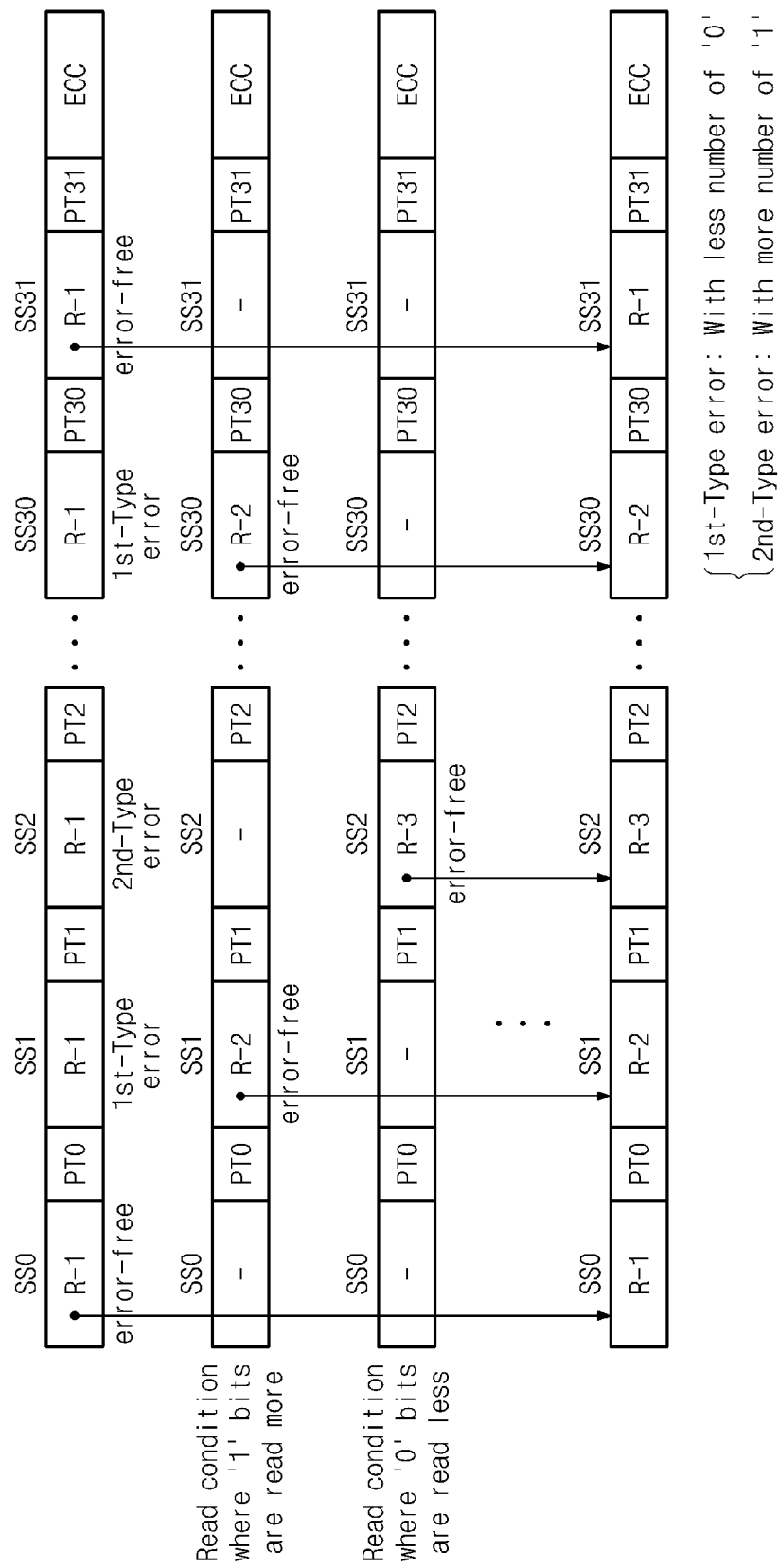
FIG. 9 is a diagram showing the manner in which data is read in accordance with another read method.

More improved methods may be utilized via the directional characteristic when X modulo 4 (X indicating the number of '1's included in a sub-sector) is used as 2-bit parity data. For example, in a case where X modulo 4 is used as parity data, when a parity value calculated from a sub-sector is different from a read-out parity value, it is possible to judge whether data of the sub-sector is data that '1' is read more or data that '1' is read less. Assuming that a calculated parity value is '00' and a read-out parity value is '01', data of the sub-sector may be judged as data that '1' is read less. In this case, a read condition is changed such that '1' is read more. As illustrated in FIG. 9, there may be read out data from a flash memory 200 according to the changed read condition. Assuming that a calculated parity value is '01' and a read-out parity value is '00', data of the sub-sector may be judged as data that '1' is read more. In this case, a read condition is changed such that '1' is read less. As illustrated in FIG. 9, there may be read out data from the flash memory 200 according to the changed read condition.

Thus, as a read voltage is again set to any direction, there is judged the direction that '1' is read more or the direction that 1' is read less. But, changing of the read condition does not surely mean the direction that an error is decreased. Nevertheless, in case of the exemplary embodiments, since an error-free sub-sector is not further processed, there is eliminated the probability that correctly read data is misread under a next condition, the parity for a sub-sector where '1' is read less is confirmed only during a read condition where '1' is read more, and a sub-sector judged not to have an error as the confirmation result is selected as final data. In other words, if no error is detected though a sub-sector where '1' is read less is read in a direction where '1' is read lesser, there is actually no error. This means that an error is eliminated since the probability that the parities are eventually matched due to additional generation of an error is high. Likewise, the probability that a sub-sector where '1' is read more is correctly read is high when the sub-sector is again read in a direction where '1' is read less. In this case, data having matched parities may be selected. In the case of performing a read operation, it is possible to reduce an error via parity confirmation.

In exemplary embodiments, an error correction processor is able to be set to operate from a point of time when a flash memory is used or after a given time (or, a given program-erase cycle) elapses.

Figure 10:
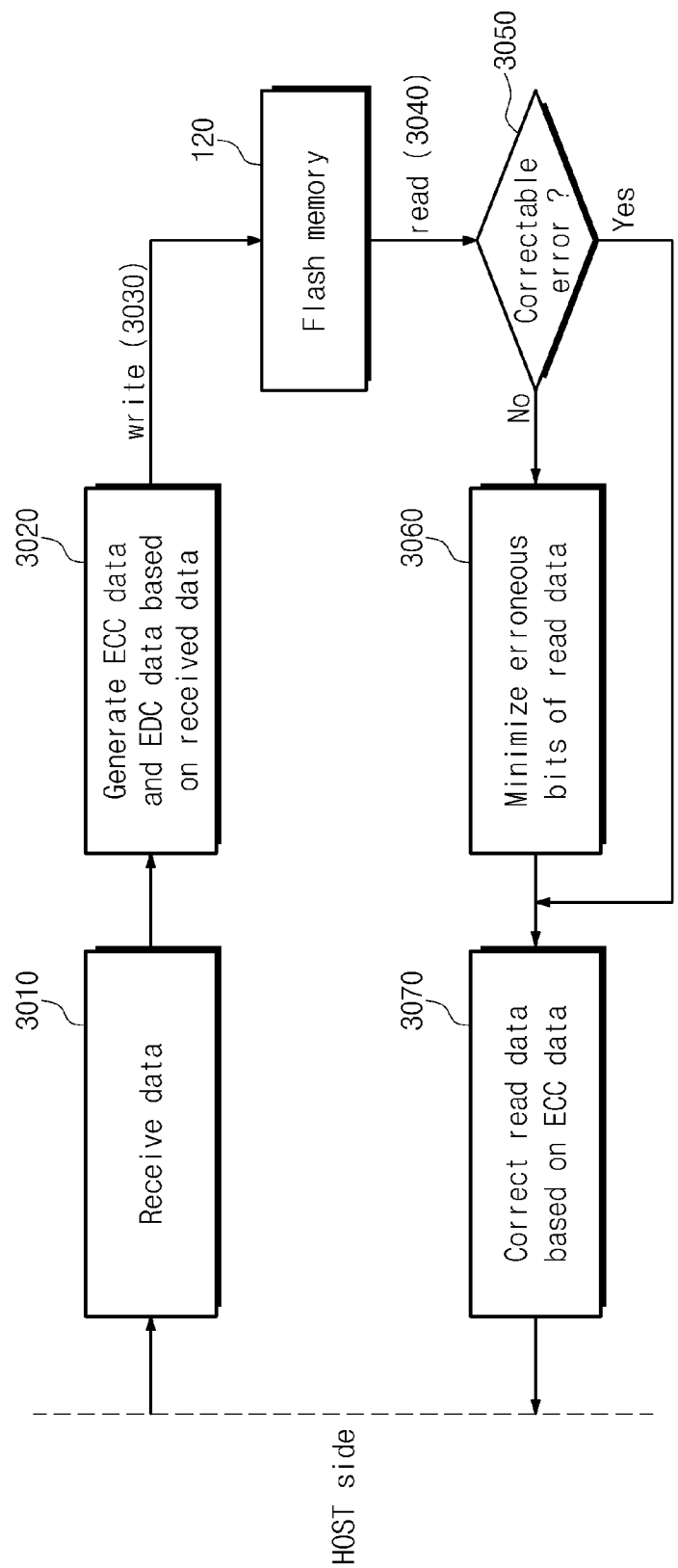
FIG. 10 is a diagram for describing data processing or handling of the memory system according to another embodiment of the invention.

FIG. 10 is a diagram for describing data processing or handling of the memory system according to another embodiment of the invention. Referring to FIG. 10, when a write operation is requested from an external device (i.e., a host system), data may be input to memory system 101 from the host system. The input data may be stored in buffer 140 via host interface 110, in block 3010. Afterwards, the stored data in the buffer 140 may be transferred to a flash memory 200. While the stored data in the buffer 140 is being transferred to a flash memory 200, an ECC block 160 may generate ECC data based on the transferred data, and an error correction processor 150 may generate EDC (error detection code) data of a sub-sector unit based on the transferred data, as shown in block 3020. Sector-unit data is formed of a plurality of sub-sectors, and EDC data is generated with respect to each sub-sector. This will be more fully described hereinafter. The transferred data may then be stored in the flash memory 200 together with the ECC data and the EDC data, as indicated by reference numeral 3030.

When a read operation is requested from the external device (host system), data may be read out from the flash memory 200, as indicated by reference numeral 3040. The read data may include original data and ECC data. An ECC block 160 may judge whether the read data is erroneous, based upon the ECC data. If the read data is judged to be erroneous, the ECC block 160 may check whether an error of the read data is correctable in block 3050. If the error of the read data is judged to be uncorrectable by the ECC data, the error correction processor 150 may minimize erroneous bits of the read data in block 3060 regardless of the ECC data. This will be more fully described afterwards. After erroneous bits of the read data are minimized, the ECC block 160 may detect and correct an error of the read data based upon the ECC data in block 3070. If an error of the read data is judged to be correctable by the ECC data in block 3050, the operation described in block 3070 may be carried out. Error-processed data may be sent to the external device (the host system).

Erroneous bits beyond the error correction capability are able to be corrected using a general error correction capability (e.g., 8-bit ECC) instead of a high-performance error correction capability (e.g., 16/24-bit ECC), by changing data so as to be suitable for error detection at a write operation and minimizing erroneous bits of the changed data at a read operation. In particular, such a data processing scheme may be useful for a memory system which stores 3-bit data or 4-bit data.

In an exemplary embodiment, an operation of minimizing erroneous bits may be conducted after a given program-erase cycle of a flash memory or after a given reference time elapses. But, such an operation is not limited to this disclosure.

Figure 11:
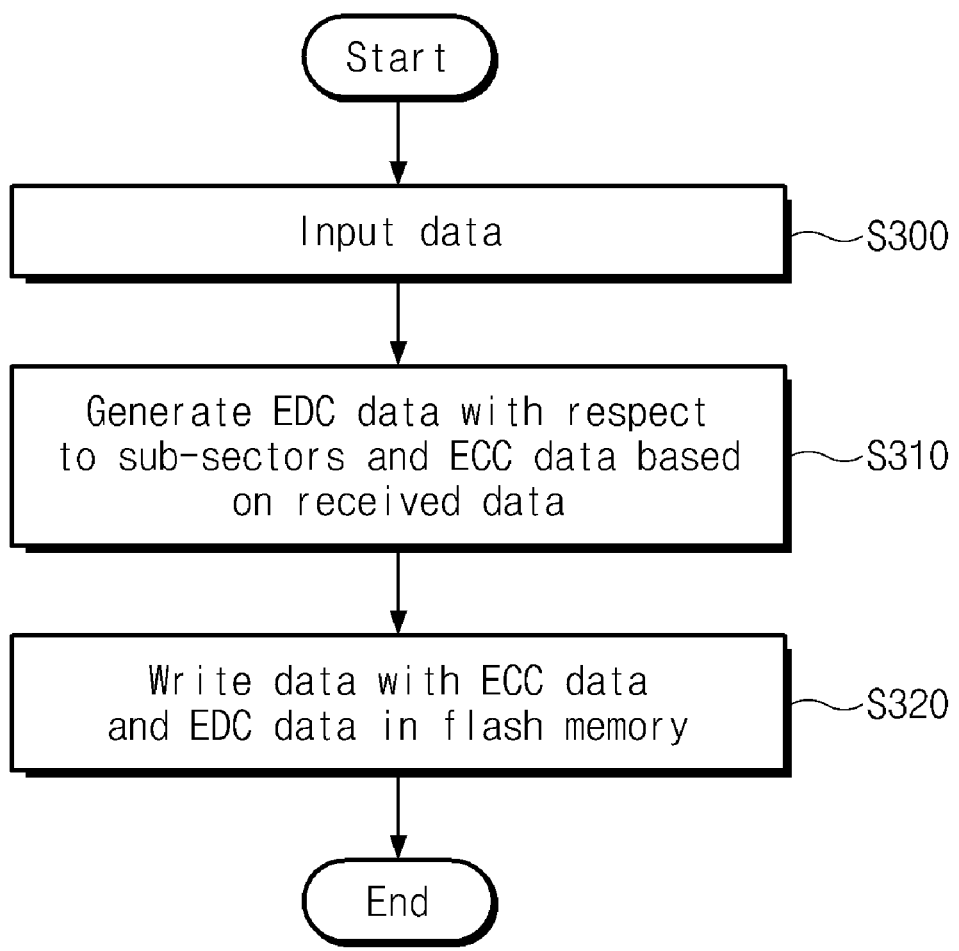
FIG. 11 is a flow chart showing a write method used in the memory system according to the another embodiment.
Figure 12:
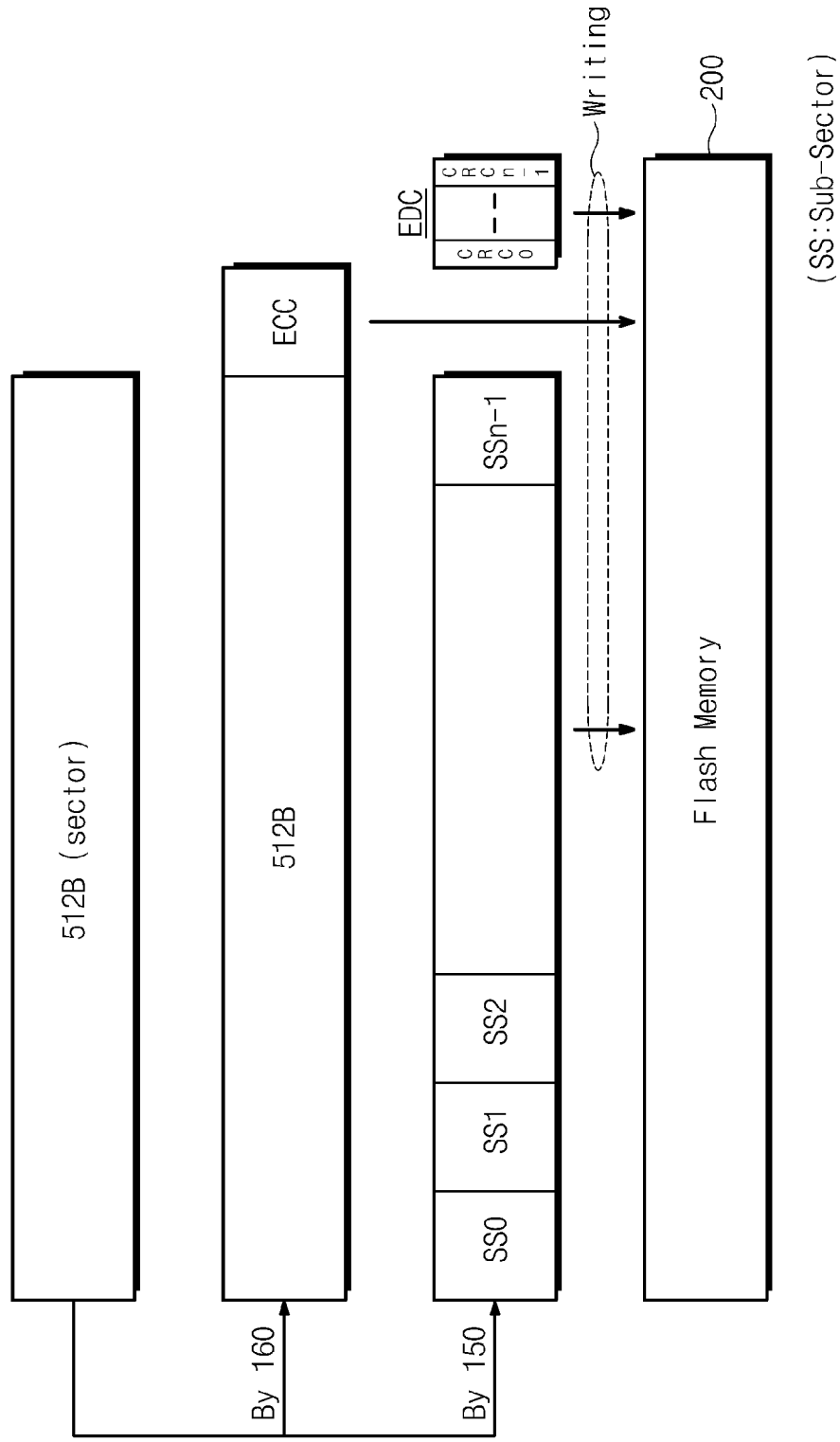
FIG. 12 is a diagram showing the manner in which data is changed in accordance with the write method of another embodiment.

FIG. 11 is a flow chart showing a write method used in the memory system according to the another embodiment, and FIG. 12 is a diagram showing the manner in which data is changed in accordance with the write method of the another embodiment. The write method of a memory system according to this embodiment will be more fully described with reference to accompanying drawings.

As a write operation is requested from an external device (i.e., a host system), data to be written in flash memory 200 may be stored in buffer 140 via a host interface 110 in step S300. For example, the input data may be sector data. That is, 512B data may be stored sequentially in the buffer 140 according to a transfer unit.

Data stored in the buffer 140 may be sent to the flash memory 200. At the time that data stored in the buffer 140 is being transferred to the flash memory 200, as illustrated in FIG. 12, the ECC block 160 may generate ECC data based on the transferred data, and the error correction processor 150 may generate EDC data by a sub-sector unit based on the transferred data. These operations may be carried out in step S310. In other words, the error correction processor 150 may divide the transferred data into sub-sectors and may generate EDC data with respect to each sub-sector. As a result, sector-unit data consists of a plurality of sub-sectors, and EDC data may be generated with respect to each sub-sector. In step S320, the input data may be stored in the flash memory 200 together with the ECC and EDC data. The input data may be stored in a main field (or region) of the flash memory 200, and the ECC and EDC data may be stored in a spare field (or region) of the flash memory 200. Such a spare field (or region) is called a page meta field (or region). Information related to a page is stored in the meta region, and EDC data and meta ECC data of related information may be stored together in the meta region.

In exemplary embodiments, the EDC data is CRC data. The CRC data may be 4-bit CRC data. But, the CRC data is not limited to the 4-bit CRC data. An increase in a bit number of the CRC data enables improved capability of detecting erroneous bits. Further, it is possible to change the number of sub-sectors variously.

Figure 13:
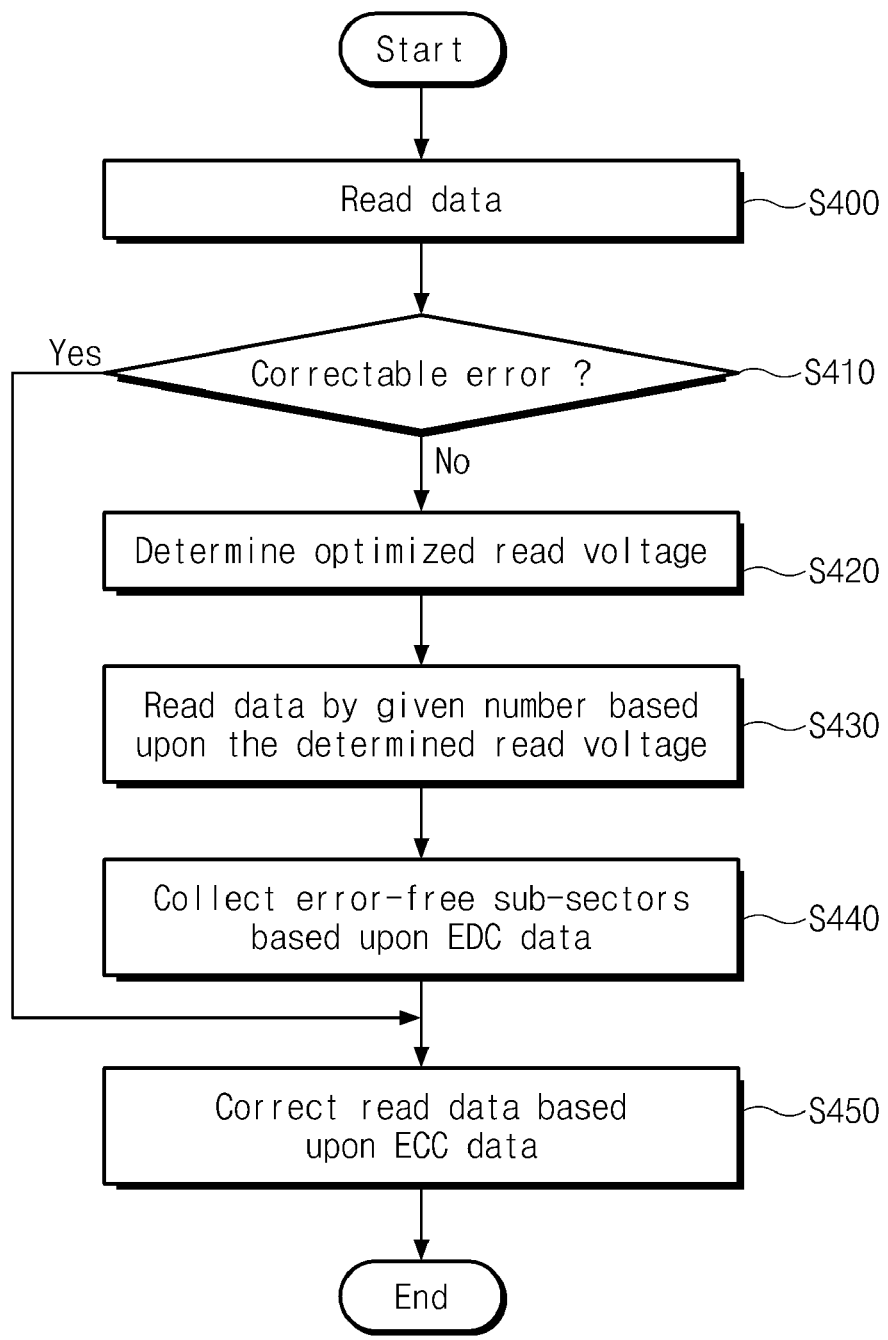
FIG. 13 is a flow chart showing a read method used in the memory system according to the another embodiment.
Figure 14:
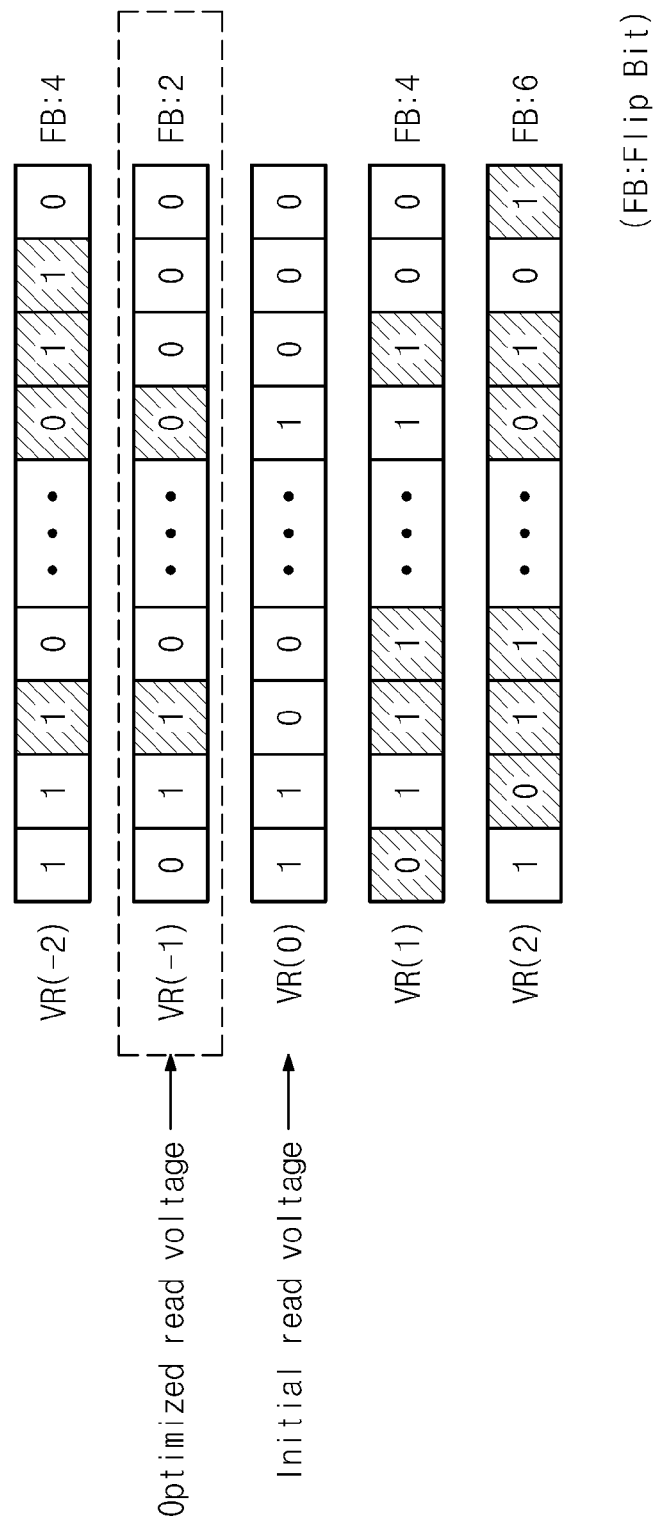
FIG. 14 is a diagram for describing a procedure of determining an optimized read voltage in accordance with the read method of the another embodiment.
Figure 15:
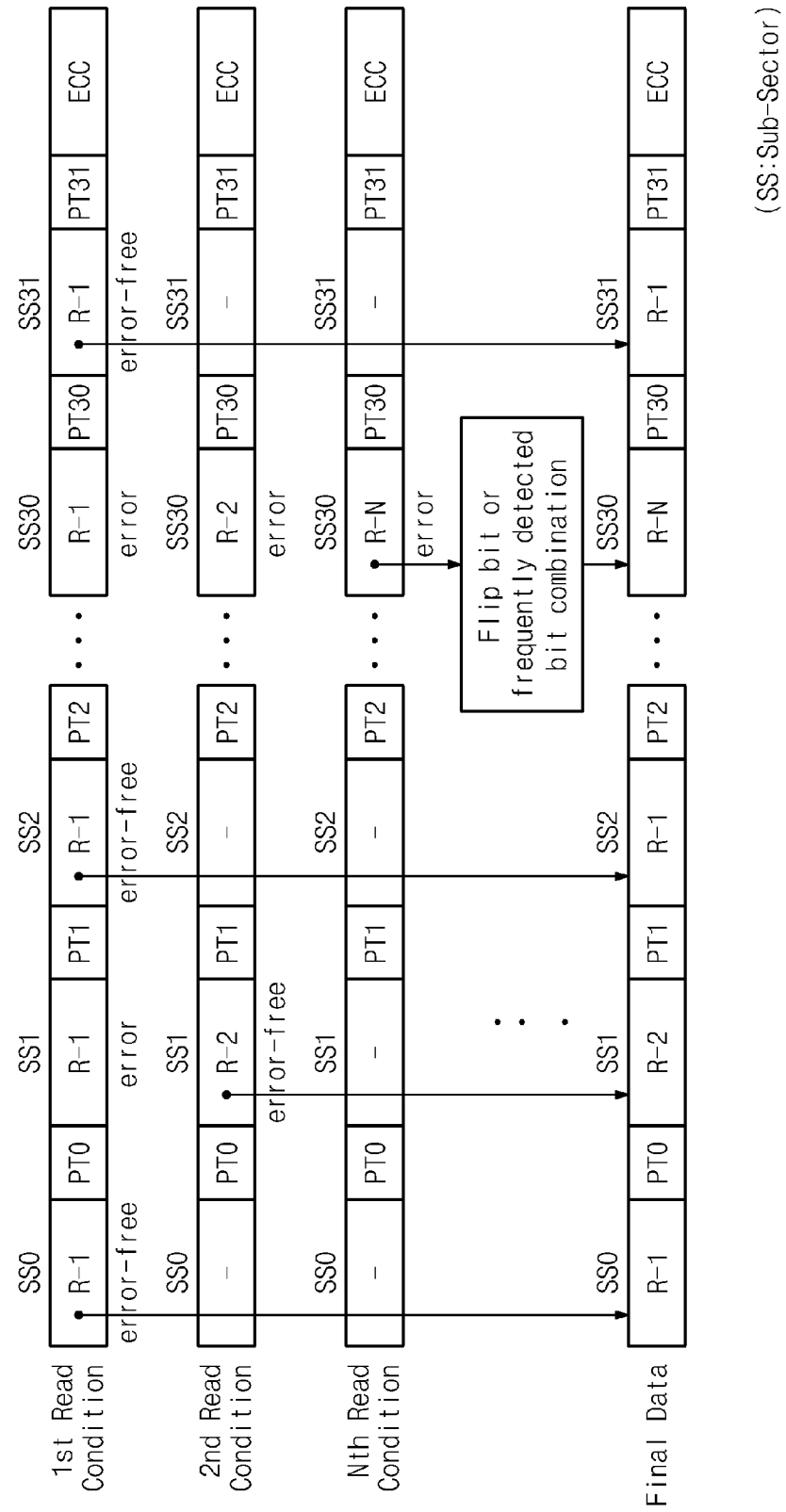
FIG. 15 is a diagram showing a data read method according to a still further embodiment.

FIG. 13 is a flow chart showing a read method used in the memory system according to this embodiment, FIG. 14 is a diagram for describing a procedure of determining an optimized read voltage in accordance with the read method, and FIG. 15 is a diagram showing a data read method. The read method of a memory system according to this embodiment will be more fully described with reference to accompanying drawings.

As a read operation is requested, data may be read out from flash memory 200 (or from a selected page of the flash memory 200) under the control of a memory controller 100. In greater detail, first in step S400 data may be read out from the flash memory 200 under the control of the memory controller 100. The read data may include ECC data and may be stored in a buffer 140. The ECC block 160 may detect whether the read data is erroneous, based upon the read data. If an error is detected, the ECC block 160 may judge in step S410 whether the detected error is correctable. If a correctable error is detected, an error of the read data may be corrected based on the ECC data according to a well-known manner in step S450. Afterwards, the read data may be sent to an external device (i.e., a host system), and the read operation may be ended. Likewise, if no error is detected, the read data may be sent to the external device (i.e., the host system) without an error correction operation, and the read operation may be ended.

Returning to step S410 in FIG. 13, if the detected error is determined not to be corrected by the ECC block 160, the procedure advances to step S420 whereby error correction processor 150 may determine an optimized read voltage. In detail and with reference to FIG. 14, data stored in the buffer 140 may be data which is read using an initial read voltage VR(0). The initial read voltage VR(0) may be a default read voltage. The error correction processor 150 may control the flash memory 200 such that a read operation is continuously conducted using read voltages VR(1) and VR(2) which are increased by a given value on the basis of the initial read voltage VR(0), and read voltages VR(−1) and VR(−2) which are decreased by a given value on the basis of the initial read voltage VR(0). Continuously read data may be stored in the buffer 140. Herein, the given value for example may be 40 mV. But, the given value is not limited to this disclosure. The error correction processor 150 may detect flipped/toggled bits of data read according to each of the changed read conditions VR(−2) to VR(2), based upon data read according to the initial read voltage VR(0). The error correction processor 150 may determine as an optimized read voltage a read voltage used to read such data that the number of flipped/toggled bits is least. For example, as illustrated in FIG. 14, the number of flipped/toggled bits of data read using the read voltage VR(−1) is least, so that the read voltage VR(−1) is determined as an optimized read voltage.

In another exemplary embodiment, an operation of determining an optimized read voltage is able to be carried out according to the control of an embedded processor 130 instead of the error correction processor 150.

Referring again to FIG. 13, after an optimized read voltage is determined, error-free sub-sectors of sub-sectors of the read data may be collected according to the EDC data in step S440, which may be made under the control of the error correction processor 150. For this, first of all, the error correction processor 150 may control the flash memory 200 in step S430 so that a read operation is continuously carried out using read voltages which are sequentially increased by a given value on the basis of the optimized read voltage, and read voltages which are sequentially decreased by a given value on the basis of the optimized read voltage. The read data may be temporarily stored in the buffer 140. Then, as set forth above, the error correction processor 150, as illustrated in FIG. 15, may select error-free sub-sectors based upon corresponding EDC data. An erroneous sub-sector (e.g., a sub-sector SS30 in FIG. 15) can exist during selecting of error-free sub-sectors. In this case, the erroneous sub-sector may be treated as an error-free sub-sector according to a combination of flipped/toggled bits or a high frequency of the flipped/toggled bits. This will be more fully described below. After error-free sub-sectors are collected in step S440, the procedure advances to step S450 in which error of the read data is corrected based upon ECC data in a well-known manner. Afterwards, the read data may be sent to an external device (i.e., a host side), and the read operation may be terminated.

In this embodiment, an operation of reading data according to changed read conditions is continuously carried out, and an error judging operation is conducted repeatedly with respect to error-free sub-sectors. On the other hand, operations of reading data and selecting error-free sub-sectors of the read data are able to be conducted independently with respect to each of changed read conditions.

In exemplary embodiments, EDC data may be read before a read condition is changed. Alternatively, EDC data may be read together with ECC data. But, the read timing of EDC data is not limited to this disclosure.

Figure 16:
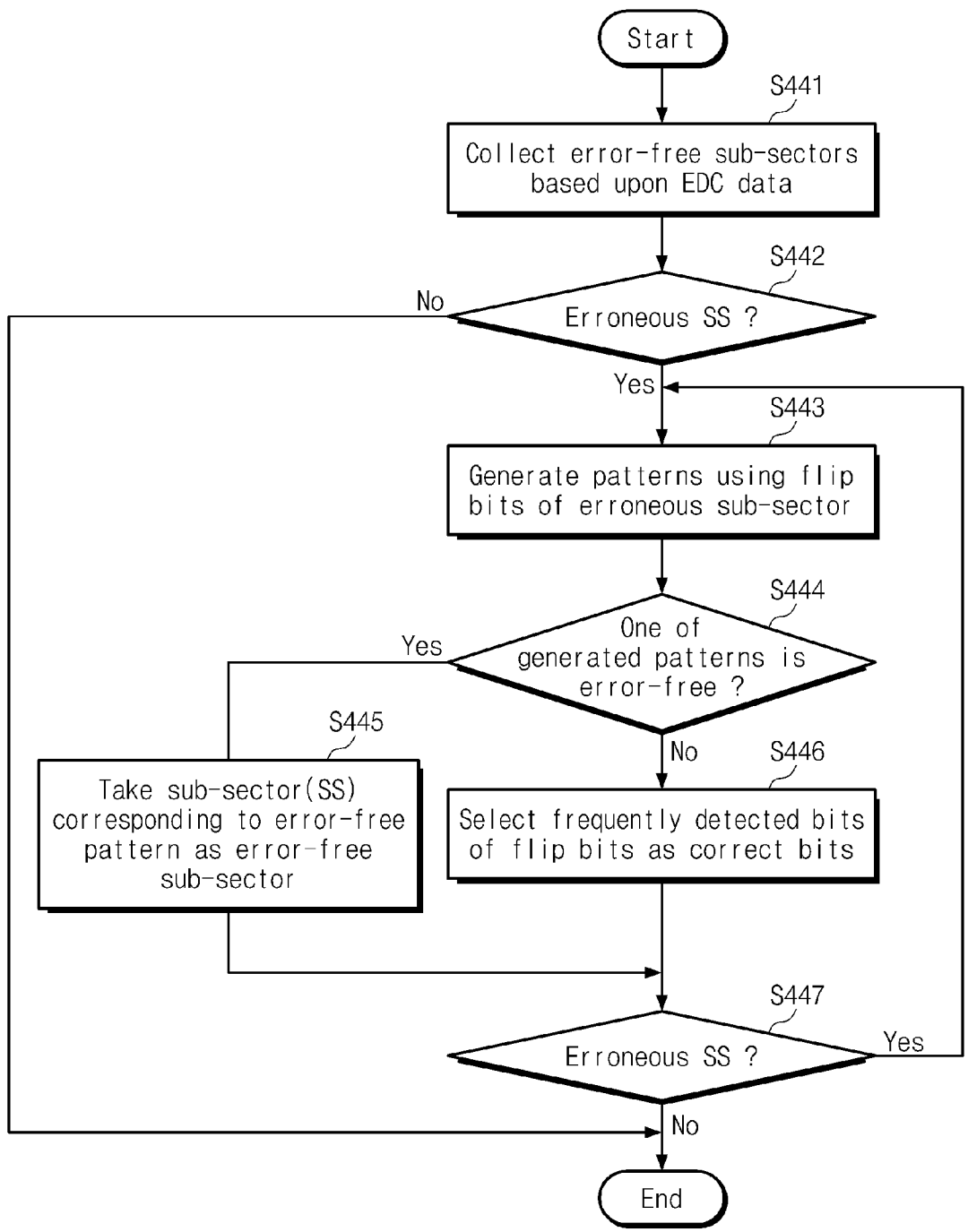
FIG. 16 is a flow chart for describing an operation of collecting error-free sub-sectors in the memory system according to another further embodiment.
Figure 17:
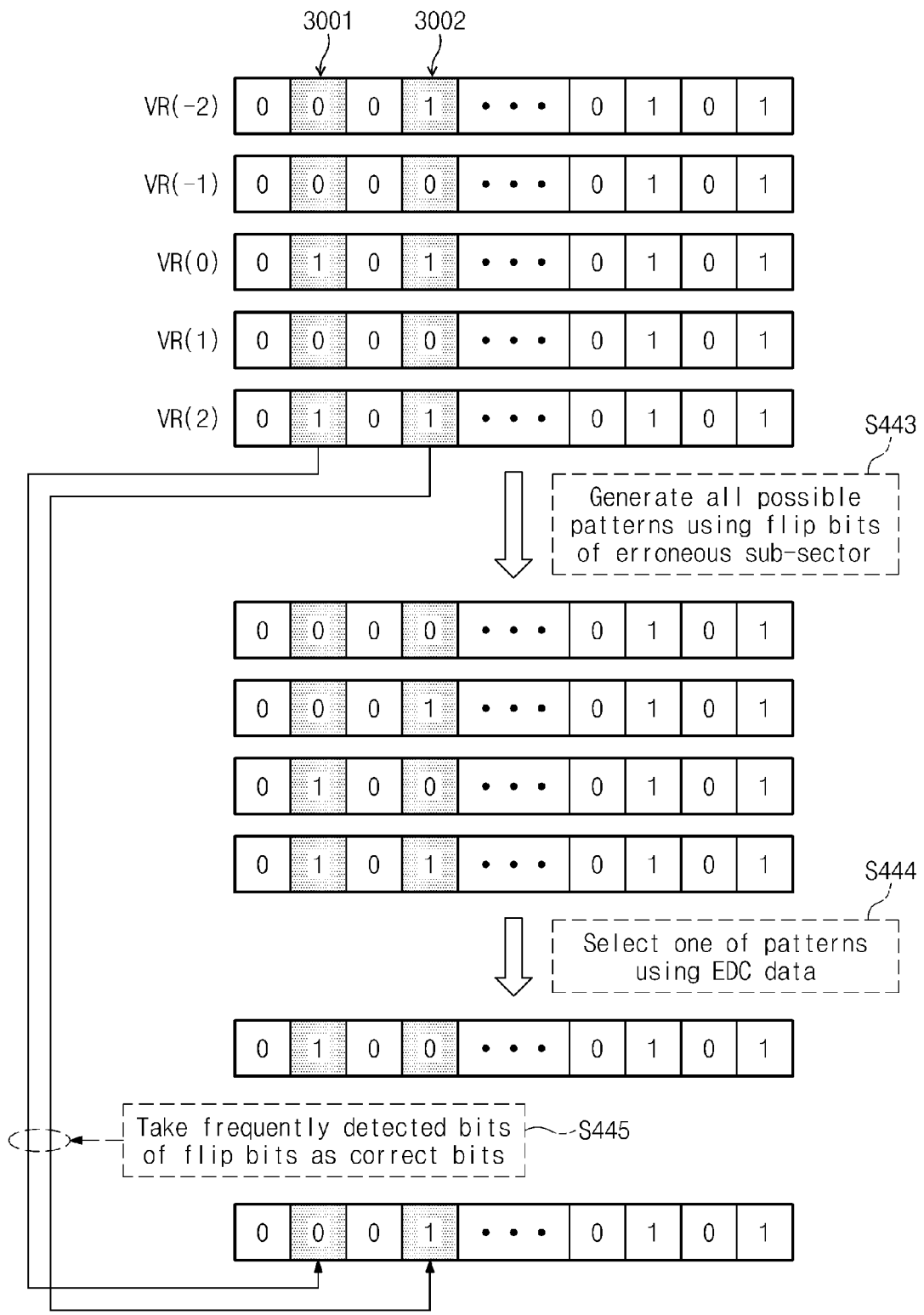
FIG. 17 is a diagram showing an operation of collecting error-free sub-sectors.

FIG. 16 is a flow chart for describing an operation of collecting error-free sub-sectors in the memory system according to another further embodiment, and FIG. 17 is a diagram showing an operation of collecting error-free sub-sectors. The operation of collecting error-free sub-sectors in a memory system will be more fully described with reference to accompanying drawings.

As described in FIG. 13, data may be continuously read according to changed read conditions, and the read data may be stored in buffer 140. Afterwards, in step S441, an error correction processor 150 may select error-free sub-sectors based upon EDC data, and as illustrated in FIG. 15, manage the selected sub-sectors as final data. In the following step S442, the error correction processor 150 may judge whether erroneous sub-sectors exist. If no erroneous sub-sectors exist, the procedure advances to step S450 of FIG. 13. If erroneous sub-sectors exist, the procedure advances to step S443, in which the error correction processor 150 may generate possible patterns using flipped/toggled bits of an erroneous sub-sector. In other words, as illustrated in FIG. 17, flipped/toggled bits (e.g., two bits) of bits of an erroneous sub-sector, that is, values of '00', '01', '10', and '00' may be used to generate four sub-sector patterns. After generating possible patterns, the error correction processor 150 may judge whether one of the generated sub-sector patterns is not erroneous in step S444 based upon corresponding EDC data. If one of the generated sub-sector patterns is judged not to be erroneous, as illustrated in FIG. 17 such a sub-sector pattern may be taken as an error-free sub-sector in step S445. Afterwards, the procedure goes to step S447.

If the generated sub-sector patterns are all judged to be erroneous, the procedure advances to step S446, in which the error correction processor 150 may take as correct bits the more frequently detected bits from flipped/toggled bits of the read data. For example, as illustrated in FIG. 17, in case of the second bit 3001, a value of '0' may be a more frequently detected bit. In case of the fourth bit 3002, a value of '1' may be a more frequently detected bit. Accordingly, a sub-sector having more frequently detected bits may be taken as an error-free sub-sector. In the following step S447, the error correction processor 150 may judge whether an additional erroneous sub-sector exists. If no additional erroneous sub-sector exists, the procedure advances to step S450 as shown in FIG. 13. If an additional erroneous sub-sector exists, the procedure advances to step S443 so that the above-described steps S443 to S446 are carried out repeatedly.

As described above, it is possible to minimize erroneous bits of read data by collecting error-free sub-sectors according to EDC data and generating an optimized sub-sector using flipped/toggled bits with respect to an erroneous sub-sector. As a result, an error is able to be corrected using a relatively low-performance ECC block instead of a relatively high-performance ECC block.

In the meantime, flash memories are kinds of nonvolatile memories capable of keeping data stored therein even without power supply. With rapid increase of using mobile apparatuses such as cellular phones, personal digital assistants (PDA), digital cameras, portable gaming consoles, and MP3, the flash memories are widely employed as code storage, as well as data storage. The flash memories may be also utilized in home applications such as high-definition TVs, digital versatile disks (DVDs), routers, and global positioning systems (GPSs).

Figure 18:
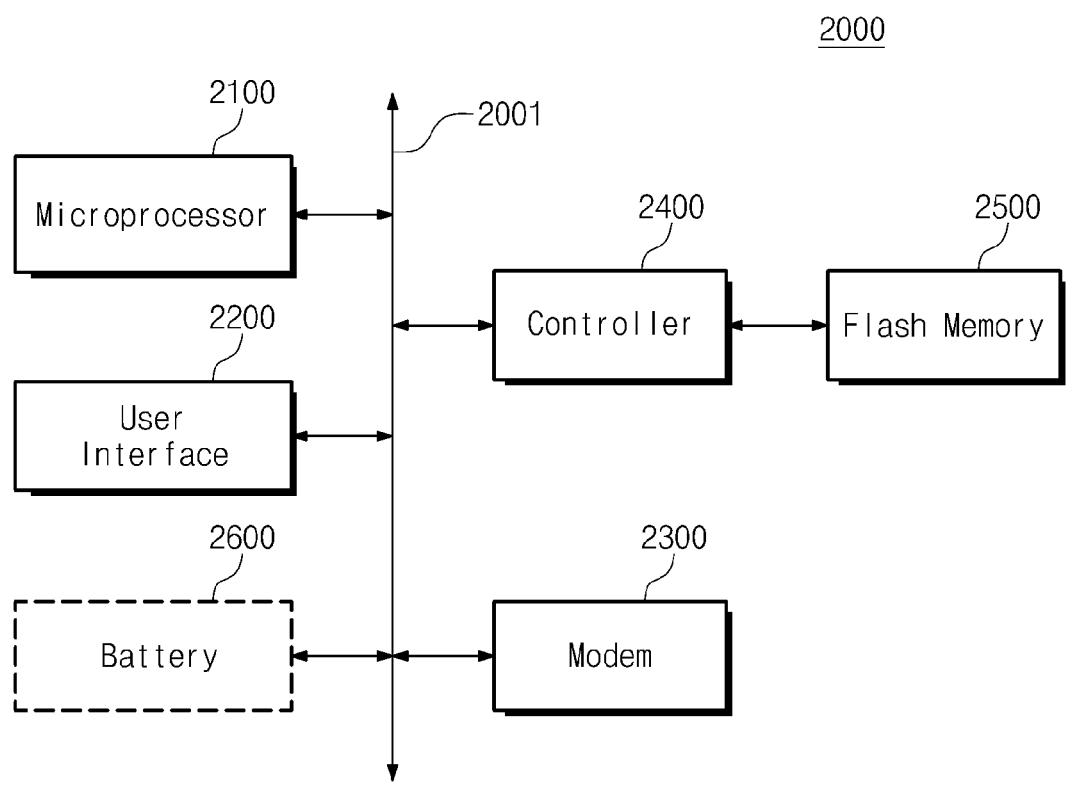
FIG. 18 is a block diagram showing a schematic computing system including a flash memory.

FIG. 18 is a block diagram showing a schematic computing system including a flash memory according to exemplary embodiments. The computing system 2000 is organized as including a processing unit 2100 such as a microprocessor or a central processing unit, a user interface 2200, a modem 2300 such as a baseband chipset, a memory controller 2400, and a flash memory 2500. The flash memory 2500 may be configured substantially the same as described above. In the flash memory 2500, N-bit data (N is a positive integer) to be processed by the processing unit 2100 are stored through the memory controller 2400. If the computing system shown in FIG. 18 is a mobile apparatus, it is further comprised of a battery 2600 for supplying power thereto. Although not shown in FIG. 18, the computing system may be further equipped with an application chipset, a camera image processor (e.g., CMOS image sensor; CIS), a mobile DRAM, etc. The memory controller 2400 and the flash memory 2500, for example, may be formed to constitute a Solid State Drive/Disk (SSD) which uses a nonvolatile memory to store data.

Figure 19:
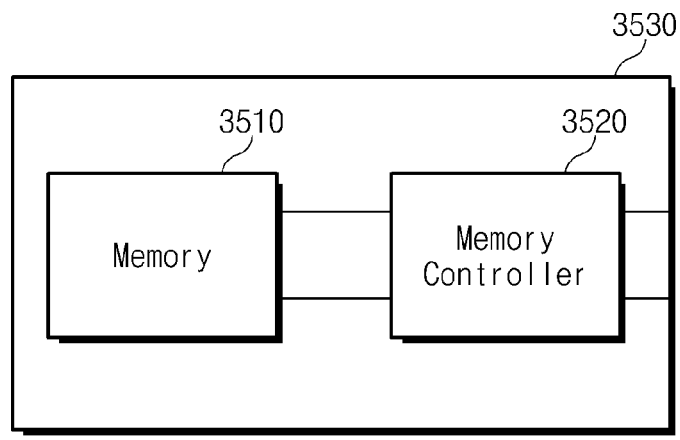
FIG. 19 is a block diagram showing a memory-based storage device.

FIG. 19 is a block diagram showing a memory-based storage device according to other exemplary embodiments. The memory-based storage device illustrated in FIG. 19 may be realized such that a memory 3510 and a memory controller 3520 constitute a card 3530. For example, the card 3530 may be a memory card such as a flash memory card. Namely, the card 3530 may be a card meeting any industry standard for use with a consumer electronics device such as a digital camera, personal computer, etc. It will be appreciated that the memory controller 3520 may control the memory 3510 based on controls signals received by the card 3530 from another (e.g., external) device.

Figure 20:
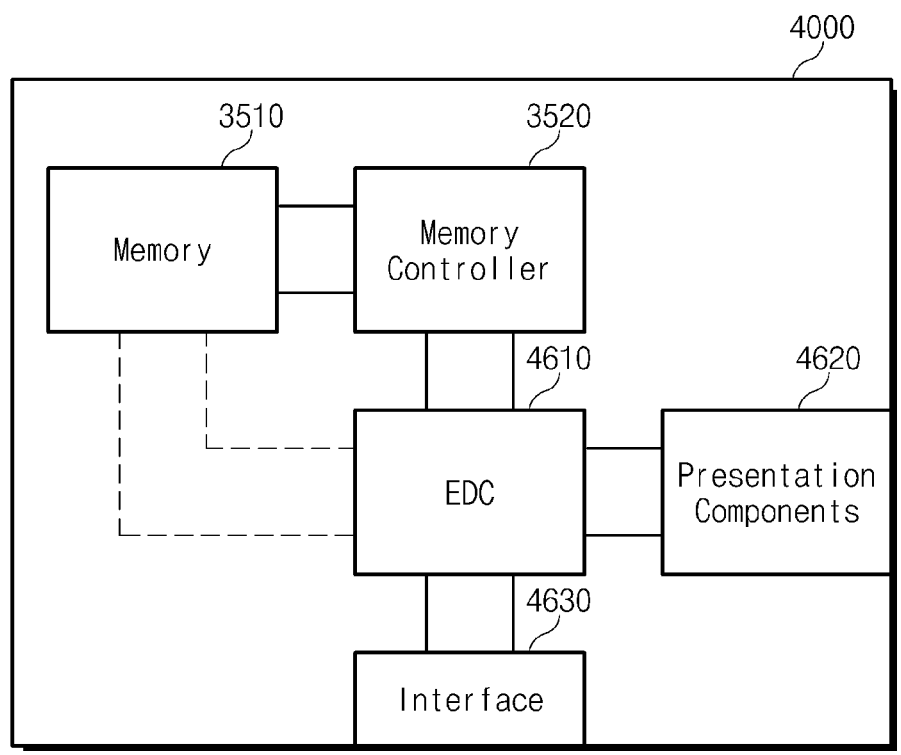
FIG. 20 is a block diagram showing a memory-based storage device.

FIG. 20 is a block diagram showing a memory-based storage device according to other exemplary embodiments. FIG. 20 represents a portable device 4000. The portable device 4000 may be an MP3 player, video player, combination video and audio player, etc. As shown, the portable device 4000 includes a memory 3510 and a memory controller 3520. The portable device 4000 may also include an encoder and decoder 4610, presentation components 4620 and interface 4630.

Data (video, audio, etc.) may be input to and output from the memory 3510 via the memory controller 3520 by encoder and decoder (EDC) 4610. As shown by the dashed lines in FIG. 20, the data may be directly input to the memory 3510 from the EDC 4610 and/or directly output from the memory 3510 to the EDC 4610.

The EDC 4610 may encode data for storage in the memory 3510. For example, the EDC 4610 may perform MP3 encoding on audio data for storage in the memory 3510. Alternatively, the EDC 4610 may perform MPEG encoding (e.g., MPEG2, MPEG4, etc.) on video data for storage in the memory 3510. Still further, the EDC 4610 may include multiple encoders for encoding different types of data according to different data formats. For example, the EDC 4610 may include an MP3 encoder for audio data and an MPEG encoder for video data.

The EDC 4610 may decode output from the memory 3510. For example, the EDC 4610 may perform MP3 decoding on audio data output from the memory 3510. Alternatively, the EDC 4610 may perform MPEG decoding (e.g., MPEG2, MPEG4, etc.) on video data output from the memory 3510. Still further, the EDC 4610 may include multiple decoders for decoding different types of data according to different data formats. For example, the EDC 4610 may include an MP3 decoder for audio data and an MPEG decoder for video data.

It will also be appreciated that EDC 4610 may include only decoders. For example, already encoded data may be received by the EDC 4610 and passed to the memory controller 3520 and/or the memory 3510.

The EDC 4610 may receive data for encoding, or receive already encoded data, via the interface 4630. The interface 4630 may conform to a known standard (e.g., firewire, USB, etc.). The interface 4630 may also include more than one interface. For example, interface 4630 may include a firewire interface, a USB interface, etc. Data from the memory 3510 may also be output via the interface 4630.

The presentation components 4620 may present data output from the memory, and/or decoded by the EDC 4610, to a user. For example, the presentation components 4620 may include a speaker jack for outputting audio data, a display screen for outputting video data, and/or etc.

A flash memory and/or a memory controller according to exemplary embodiments may be packed using various types of packages, such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Example embodiments being thus described, it will be obvious that the same may be varied in many ways. Such variations are not to be regarded as a departure from example embodiments, and all such modifications are intended to be included within the scope of append claims.

What is claimed is:

1. A data processing method of a memory system including a flash memory, comprising:
    judging whether data initially read from a selected page of the flash memory is correctable;
    newly reading the data from the selected page based upon each of newly determined read voltages, if the initially read data is judged not to be correctable;
    collecting error-free sub-sectors of the newly read data, based upon EDC (error detection code) data corresponding to the initially read data; and
    correcting data of the error-free sub-sectors based upon ECC (error correction code) data corresponding to the initially read data.

2. The data processing method of claim 1, wherein determination of first read voltages as the newly determined read voltages used to newly read data from the selected page comprises:
    continuously reading data from the selected page using second read voltages, the second read voltages are voltages that are respectively stepwise increased and decreased from an initial read voltage used to read the initially read data;
    determining as an optimized read voltage one of the second read voltages corresponding to the continuously read data that has a least number of flipped/toggled bits as compared to the initially read data; and
    selecting third read voltages as the first read voltages, the third read voltages are voltages that are respectively stepwise increased and decreased from the optimized read voltage.

3. The data processing method of claim 2, wherein an increment of the third read voltages is set to be identical with a decrement of the third read voltages.

4. The data processing method of claim 1, wherein said collecting error-free sub-sectors comprises:
    judging whether any of the sub-sectors of the newly read data are erroneous sub-sectors;
    generating sub-sector patterns using flipped/toggled bits of the erroneous sub-sector, if an erroneous sub-sector exists;
    judging whether each of the sub-sector patterns is erroneous or not, based upon EDC data corresponding to the initially read data; and
    collecting a sub-sector pattern judged not to be erroneous as an error-free sub-sector.

5. The data processing method of claim 4, wherein if the sub-sector patterns are all judged to be erroneous, the erroneous sub-sector is changed to an error-free sub-sector by
    selecting as correct bits more frequently detected bits of flipped/toggled bits of the sub-sector patterns read according to each of the newly determined read voltages; and
    replacing the flipped/toggled bits with the selected correct bits.

6. The data processing method of claim 1, wherein if an erroneous sub-sector is detected while the error-free sub-sectors are collected, the erroneous sub-sector is changed to an error-free sub-sector based upon a combination of flipped/toggled bits of data read according to each of the newly determined read voltages and more frequently detected bits of the flipped/toggled bits.

7. The data processing method of claim 1, wherein if an erroneous sub-sector is detected while the error-free sub-sectors are collected, the collecting of error-free sub-sectors comprises:
    selecting as correct bits more frequently detected bits of flipped/toggled bits of data read according to each of the newly determined read voltages; and
    replacing the flipped/toggled bits with the selected correct bits to change the erroneous sub-sector to an error-free sub-sector.

8. The data processing method of claim 1, wherein the flash memory is a NAND flash memory which stores single-bit data or M-bit data, wherein M is an integer greater than or equal to 2).

9. The data processing method of claim 1, wherein the memory system is either one of a memory card and an SSD (solid state drive/disk).

10. The data processing method of claim 1, wherein said reading the data, said collecting, and said correcting are conducted after a program-erase cycle of the flash memory after a reference time elapses.

11. The data processing method of claim 1, wherein the data read from the selected page is sector data formed of a plurality of the sub-sectors, and when the sector data is written in the selected page, the EDC data is generated to correspond to each of the plurality of sub-sectors.

12. The data processing method of claim 11, wherein the EDC data is stored in a page meta region corresponding to the selected page.

13. The data processing method of claim 11, wherein a unit of the sector data is an ECC processing unit.

14. The data processing method of claim 11, wherein the EDC data is CRC data.

15. A memory system comprising:
a flash memory; and
a memory controller including an error correction processor and an ECC (error correction code) block, the memory controller configured to control the flash memory,
wherein when data initially read from a selected page of the flash memory is judged not to be correctable by the ECC block,
the error correction processor controls the flash memory such that the data is newly read from the selected page according to each of newly determined read voltages, and
the error correction processor collects error-free sub-sectors of the newly read data based upon EDC (error detection code) data corresponding to the initially read data.

16. The memory system of claim 15, wherein the ECC block corrects data of the error-free sub-sectors based upon ECC data of the initially read data.

17. The memory system of claim 15, wherein upon detection of an erroneous sub-sector during collecting of the error-free sub-sectors, the error correction processor changes the erroneous sub-sector to an error-free sub-sector according to a combination of flipped/toggled bits of the data read according to each of the newly determined read voltages and more frequently detected bits of the flipped/toggled bits.

18. The memory system of claim 15, wherein upon detection of an erroneous sub-sector during collecting of the error-free sub-sectors, the error correction processor changes the erroneous sub-sector to an error-free sub-sector by
selecting as correct bits more frequently detected bits of flipped/toggled bits of data read according to each of the newly determined read voltages; and
replacing the flipped/toggled bits with the selected correct bits.

19. The memory system of claim 15, wherein the error correction processor collects error-free sub-sectors by
judging whether any of the sub-sectors of the newly read data are an erroneous sub-sector;
generating sub-sector patterns using flipped/toggled bits of the erroneous sub-sector, if an erroneous sub-sector exists;
judging whether each of the sub-sector patterns is erroneous or not, based upon EDC data corresponding to the initially read data; and
collecting a sub-sector pattern judged not to be erroneous as an error-free sub-sector.

20. The memory system of claim 19, wherein if the sub-sector patterns are all judged to be erroneous, the error correction processor changes the erroneous sub-sector to an error-free sub-sector by
selecting as correct bits more frequently detected bits of flipped/toggled bits of the sub-sector patterns read according to each of the newly determined read voltages; and
replacing the flipped/toggled bits with the selected correct bits.

* * * * *